(12) United States Patent
Clark et al.

(10) Patent No.: US 7,479,193 B1
(45) Date of Patent: Jan. 20, 2009

(54) PREPARATION OF POSITIVE MAGNETOSTRICTIVE MATERIALS FOR USE UNDER TENSION

(75) Inventors: Arthur E. Clark, Adelphi, MD (US); Marilyn Wun-Fogle, Potomac, MD (US); James B. Restorff, College Park, MD (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 490 days.

(21) Appl. No.: 11/058,710

(22) Filed: Feb. 11, 2005

Related U.S. Application Data

(60) Provisional application No. 60/543,650, filed on Feb. 12, 2004.

(51) Int. Cl.
*H01F 1/14* (2006.01)
*H01F 1/147* (2006.01)

(52) U.S. Cl. .................. 148/108; 148/103; 148/121

(58) Field of Classification Search .............. None
See application file for complete search history.

(56) References Cited

U.S. PATENT DOCUMENTS

| | | | |
|---|---|---|---|
| 3,418,163 A | 12/1968 | Oberg et al. | |
| 4,763,030 A * | 8/1988 | Clark et al. | 310/26 |
| 6,139,648 A | 10/2000 | Wun-Fogle et al. | |
| 6,176,943 B1 | 1/2001 | Wun-Fogle et al. | |
| 2006/0054246 A1* | 3/2006 | Guruswamy et al. | 148/108 |

OTHER PUBLICATIONS

U.S. Appl. No. 60/543,650, filed Feb. 12, 2004, entitled "Preparation of Positive Magnetostrictive Materials for Operation under Tension," joint inventors Arthur E. Clark, James B. Restorff and Marilyn Wun-Fogle.
U.S. Appl. No. 11/274,635, filed Nov. 15, 2005, entitled "Method of Achieving High Transduction Under Tension or Compression," joint inventors Arthur E. Clark, James B. Restorff and Marilyn Wun-Fogle.
U.S. Appl. No. 60/882,259, filed Dec. 28, 2006, entitled "Fe-X (X=Ga,Al) Bimetallic Strips for Energy Harvesting, Actuation and Sensing" joint inventors Arthur E. Clark, James B. Restorff and Marilyn Wun-Fogle.
U.S. Appl. No. 11/822,778, filed Jul. 10, 2007, entitled "Galfenol Steel," joint inventors Arthur E. Clark, Thomas A. Lograsso, and Marilyn Wun-Fogle.
"Enhancement of Magnetostrictive Effects for Sensor Applications," M. Wun-Fogle, H. T. Savage, and M.L. Spano, J. Materials Engineering, vol. 11, No. 1, 1989, p. 103 Jun. 2004.

(Continued)

*Primary Examiner*—John P. Sheehan
(74) *Attorney, Agent, or Firm*—Jane M. Barrow

(57) ABSTRACT

A positive magnetostrictive material such as a ferromagnetic alloy is subjected to a magnetic field during annealing treatment while being heated for a predetermined period of time at an elevated temperature below its softening temperature followed by cooling resulting in a treated ferromagnetic material having high tensile strength and positive magnetostriction properties for enhancing use thereof under tensile loading conditions. Such treatment of the ferromagnetic alloy may be augmented by application thereto of a compressive stress.

3 Claims, 2 Drawing Sheets

OTHER PUBLICATIONS

The Effect of Longitudinal Stress and Torsional Strain on the Magnetization of Amorphous Magnetoelastic Wires, Marilyn Wun-Fogle, H. T. Savage, Stuart S. Antman, L. T. Kabacoff, Anales De Fisica, Serie B, p. 277, vol. 86 1990.

Magnetostriction and Magnetic Anisotropy of Field Annealed Metglas* 2605 Alloys via dc M-H loop measurement under stress; M. L. Spano, K. B. Hathaway, and H. T. Savage; J. Appl. Phys. 53 (3), Mar. 1982, p. 2667.

Wun-Fogle, M., Restorff, J.B., and Clark, A.E., "Magnetostriction of Stress Annealed Fe-Ga-Al and Fe-Ga Alloys Under Compressive and Tensile Stress", SPIE 11th Annual Int. Symposium on Smart Structures and Materials Mar. 14-18, 2004, pp. 1-8.

Wun-Fogle, M., Restorff, J.B., Clark,A.E., Dreyer, Erin and Summers Eric, "Stress Annealing of Fe-Ga Transduction Alloys for Operation Under Tension and Compression", Journal of Applied Physics vol. ##, No. ##, May 2005 pp. 1-3.

Wun-Fogle, Marilyn, Restorff, James, and Clark, Arthur, Stress Annealing of Galfenol for Operation Under Compression and Tension, Galfenol Workshop Jan. 29, 2004 11 pages.

U.S. Appl. No. 60/543,650 filed Feb. 12, 2004 entitled "Preparation of Positive Magnetostrictive Materials for Operation under Tension".

* cited by examiner

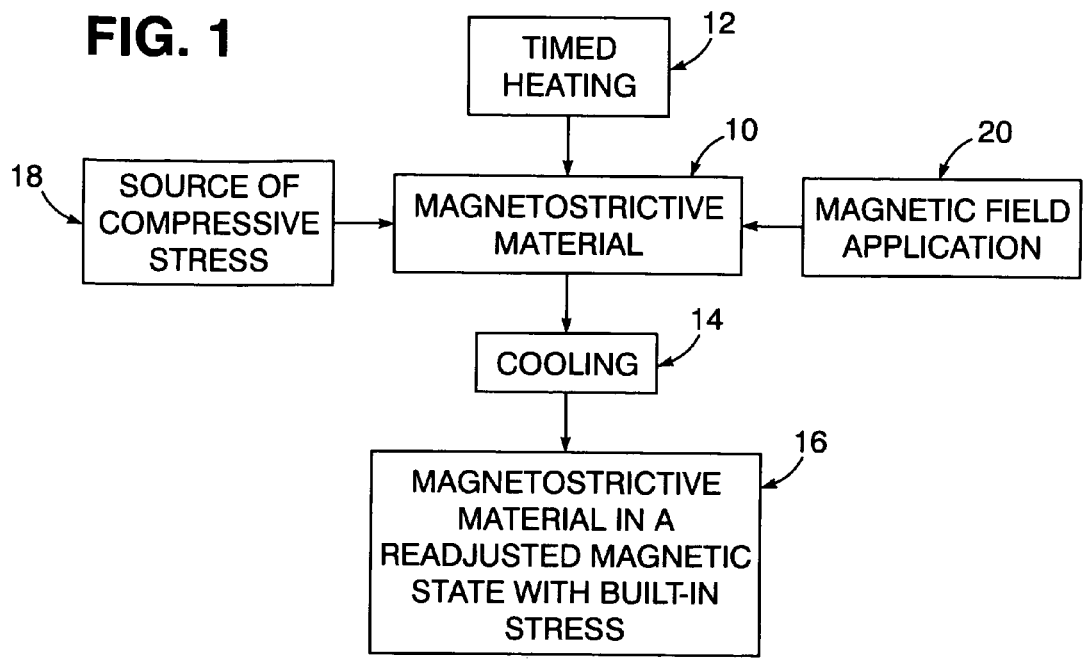
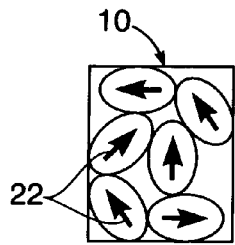
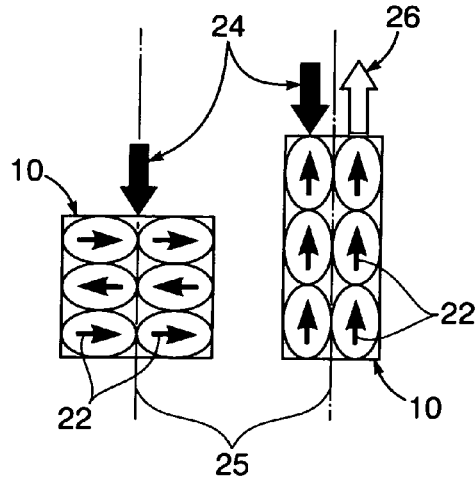
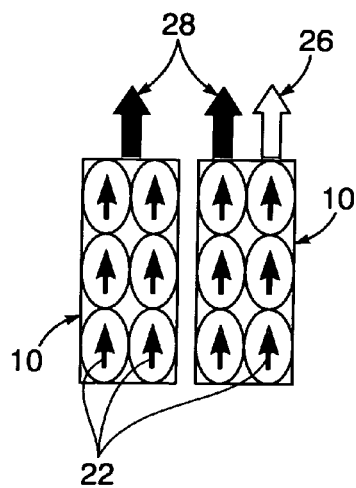

PREPARATION OF POSITIVE MAGNETOSTRICTIVE MATERIALS FOR USE UNDER TENSION

CROSS-REFERENCE TO RELATED APPLICATION

This application claims the benefit of U.S. provisional application No. 60/543,650 filed Feb. 12, 2004, hereby incorporated herein by reference, entitled "Preparation of Positive Magnetostrictive Materials for Operation Under Tension," joint inventors Arthur E. Clark, James B. Restorff and Marilyn Wun-Fogle.

STATEMENT OF GOVERNMENT INTEREST

The invention described herein may be manufactured and used by or for the Government of the United States of America for governmental purposes without the payment of any royalties thereon or therefore.

This application is related to U.S. nonprovisional application Ser. No. 11/053,753, filed 31 Jan. 2005, hereby incorporated herein by reference, entitled "High Magnetostriction of Positive Magnetostrictive Materials under Tensile Load," joint inventors Arthur E. Clark, James B. Restorff and Marilyn Wun-Fogle; this application is related to U.S. nonprovisional patent application Ser. No. 11/274,635, filed 15 Nov. 2005, entitled "Method of Achieving High Transduction Under Tension or Compression" joint inventors Arthur E. Clark, James B. Restorff and Marilyn Wun-Fogle; and the present application claims the benefit of U.S. provisional application Ser. No. 60/543,650, filed 12 Feb. 2004, hereby incorporated herein by reference, entitled "Preparation of Positive Magnetostrictive Materials for Operation under Tension," joint inventors Arthur E. Clark, James B. Restorff and Marilyn Wun-Fogle.

This application is related to U.S. nonprovisional application Ser. No. 11/007,953, filed 7 Dec. 2004, now abandoned, hereby incorporated herein by reference, entitled "Magnetostrictive Materials, Devices and Methods using High Magnetostriction, High Strength Fe-Ga Alloys", joint inventors Arthur E. Clark, James B. Restorff and Marilyn Wun-Fogle; which is a continuation of U.S. nonprovisional application Ser. No. 10/182,095, filed 24 Jul. 2002, now abandoned, hereby incorporated herein by reference, entitled "Magnetostrictive Devices and Methods using High Magnetostriction, High Strength Fe-Ga Alloys", joint inventors Arthur E. Clark, James B. Restorff and Marilyn Wun-Fogle, and Thomas A. Lograsso and Rick Allen Kellogg which claims the benefit of PCT application No. PCT/US01/02795, filed 29 Jan. 2001, hereby incorporated herein by reference, entitled "Magnetostrictive Devices and Methods using High Magnetostriction, High Strength Alloys", joint inventors Arthur E. Clark, James B. Restorff and Marilyn Wun-Fogle, Sivaraman Guruswamy and Nakorn Srisukhumbowornchai which claims the benefit of U.S. provisional application No. 60/178,615, filed 28 Jan. 2000, hereby incorporated herein by reference, entitled "Strong Ductile, and Low Field Magnetostrictive Alloys", joint inventors Arthur E. Clark, James B. Restorff and Marilyn Wun-Fogle, Sivaraman Guruswamy and Nakorn Srisukhumbowornchai.

This application is related to U.S. nonprovisional application Ser. No. 10/750,634, filed 24 Dec. 2003, hereby incorporated herein by reference, entitled "Magnetostrictive Materials, Devices and Methods using High Magnetostriction, High Strength FeGa and FeBe Alloys", joint inventors Arthur E. Clark, James B. Restorff and Marilyn Wun-Fogle, Thomas A. Lograsso and Rick Allen Kellogg; which is a continuation-in-part of the aforementioned U.S. nonprovisional application Ser. No. 10/182,095, filed 24 Jul. 2002, hereby incorporated herein by reference, entitled "Magnetostrictive Devices and Methods using High Magnetostriction, High Strength Fe-Ga Alloys", joint inventors Arthur E. Clark, James B. Restorff and Marilyn Wun-Fogle. This application is related to U.S. nonprovisional application Ser. No. 11/296,726, filed on 29 Nov. 2005, entitled "Magnetostrictive Materials, Devices and Methods using High Magnetostriction, High Strength FeGa and FeBe Alloys," joint inventors Arthur E. Clark, James B. Restorff, Marilyn Wun-Fogle, Thomas A. Lograsso and Rick Allen Kellogg which is a continuation-in-part of U.S. nonprovisional application Ser. No. 10/750,634, filed on 24 Dec. 2003.

The present invention relates to annealing treatment of certain ferromagnetic alloys to obtain a positive magnetostrictive material for use under tension.

BACKGROUND OF THE INVENTION

Recently, ferromagnetic alloys (Fe-Ga) have been developed for use as transduction material under tensile loading as wire cables or bars for example, because of their high physical tensile strength and magnetostrictive property. However certain problems arise during such tensile loading because of the rotation of the material magnetization toward the physical loading stress axis. Such magnetization rotation under loading was undesirable because magnetization becomes axially aligned with the tensile stress so as to preclude any magnetostrictive change in material length under an axially applied magnetic field.

Compressive stress was applied during annealing treatment to magnetostrictive material such as Terfenol-D according to U.S. Pat. No. 6,139,648, the entire contents of which are incorporated herein by reference, so as to maximize magnetostriction during use in transducers or the like. However, because magnetostrictive materials similar to Terfenol-D are brittle, they cannot be used in environments subject to significant tensile loading.

The present invention is the use of positive magnetostrictive materials under tensile loading conditions.

BRIEF DESCRIPTION OF THE DRAWINGS

A more complete appreciation of the invention and many of its attendant advantages will be readily appreciated as the same becomes better understood by reference to the following detailed description when considered in connection with the accompanying drawings wherein:

FIG. 1 is a block diagram illustrating annealing treatment for selected magnetostrictive material prior to use under tensile stress conditions pursuant to the present invention;

FIGS. 2(A), 2(B) and 2(C) are diagrams of the magnetostrictive material before undergoing the annealing treatment diagrammed in FIG. 1.

DETAILED DESCRIPTION OF PREFERRED EMBODIMENTS

Figure 3A:
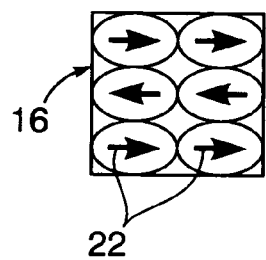
FIGS. 3(A), 3(B), 3(C), 3(D) and 3(E) are diagrams of the magnetostrictive material under different conditions after undergoing the annealing treatment.

FIG. 1 diagrams an annealing treatment process such as that disclosed in U.S. Pat. No. 6,139,648, wherein a certain type of untreated positive magnetostrictive material 10 is subjected to an annealing process involving timed heating 12 under conditions avoiding material damage, followed by a stage of cooling 14 in order to produce a treated material 16 in a readjusted magnetic state with a built-in stress for subsequent use under a magnetic field and tensile stress loading with improved energy conversion efficiency. The annealing process of the present invention similar to that disclosed in U.S. Pat. No. 6,139,648 when modified so as to produce the treated material 16 accommodating the subsequent tensile stress loading.

According to one embodiment of the present invention, the magnetostrictive material 10 is a selected ferromagnetic alloy, such as a single crystal or a polycrystal type having a formula: $Fe_{1-x}Ga_x$ or $Fe_{1-x-y}Ga_xAl_y$, preferably where $x+y<0.35$. Such selected material 10 is subjected to compressive stress from a source 18 up to its compressive yield strength. Such compressive stress from the source 18 is externally generated and applied uniaxially to the material 10 while undergoing the timed heating 12 within a furnace chamber, for a set time, e.g., 20 minutes, to an elevated temperature below the material softening temperature, typically above 100° C. Such compressive stress is maintained on the material 10 during the following state of cooling 14 as a result of which the material 10 is microstructurally readjusted by stress anistropy into the treated material 16. Furthermore, because of the foregoing described annealing treatment process, strong and large positive magnetostriction properties are endowed within the treated material 16 for subsequent use thereof under tensile and compressive work loading in magneto-mechanical energy installations such as converters, active damping structures and waste energy harvesting equipment.

An positive magnetostrictive material may be used. Some possible examples include alloys of iron and gallium, alloys of iron and aluminum and alloys of iron and beryllium. Ternary and quaternary alloys may also be used, for example alloys of iron, gallium and aluminum and alloys of iron, gallium, aluminum and cobalt.

As an option for possible use in association with the foregoing described annealment processing of the magnetostrictive material 10, the application of stress thereto from the source 18 may be augmented by or substituted with the application 20 of a magnetic field along an axis perpendicular to the stress axis. The strength of the magnetic field will depend on the type of material and its shape. However, the magnetic field should be sufficient to saturate or nearly saturate the magnetic moments (the magnetization).

The positive magnetostrictive material 10 prior to its annealment processing with no physical stress therein, is in a moderate textural state reflected by magnetic moments 22 that are randomly aligned as indicated by arrows in FIG. 2(A). When a physical stress 24, that is compressive as indicated by a solid black arrow in FIG. 2(B), is applied to the material 10, the magnetic moments 22 therein become aligned in perpendicular relation to a predetermined axis 25 of the physical compressive stress 24 being applied thereto. When a magnetic field 26 as indicated by open arrows in FIGS. 2 and 3 is then applied to the material 10 as shown in FIG. 2(B) so as to yield magnetostriction of the material 10, the magnetic moments 22 are rotated into parallel alignment with the predetermined material stress axis 25. If a physical tensile stress 28 is subsequently applied to the material 10 as reflected by solid black arrow in FIG. 2(C), the magnetic moments 22 become axially aligned parallel to the physical tensile stress 28 when a magnetic field 26 is applied to material 10 as shown in FIG. 2(C) there is no effect.

Figure 3B:
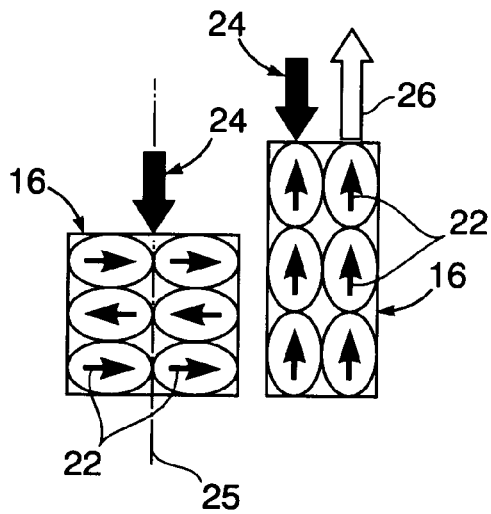

After the annealment processing of the positive magnetostrictive material 10 as hereinbefore described, the magnetic moments 22 of the processed material 16 as shown in FIG. 3(A) remain directionally unchanged in perpendicular alignment relation to the compressive annealing stress 24 when applied as shown in FIG. 3(B). The application of the magnetic field 26 during subsequent use then rotates the magnetic moments 22 into parallel relation to the applied compressive stress 24 within the fully processed material 16 as also shown in FIG. 3(B). Such application of the magnetic field 26 during use to the processed material 16 causes fractional deformation in the shape thereof.

Figure 3C:
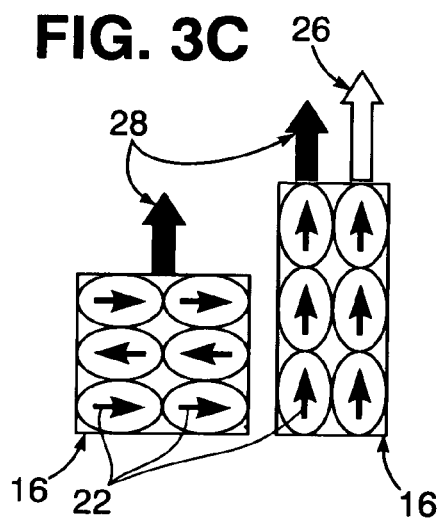
Figure 3D:
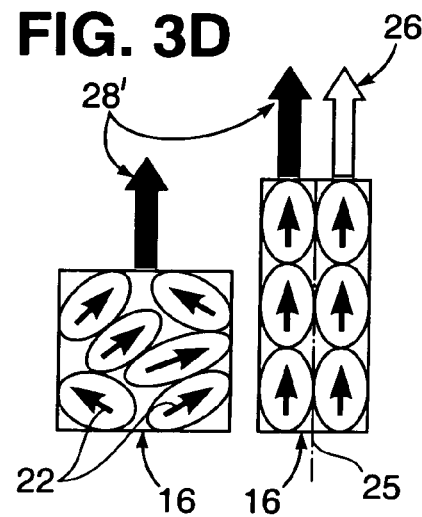
Figure 3E:
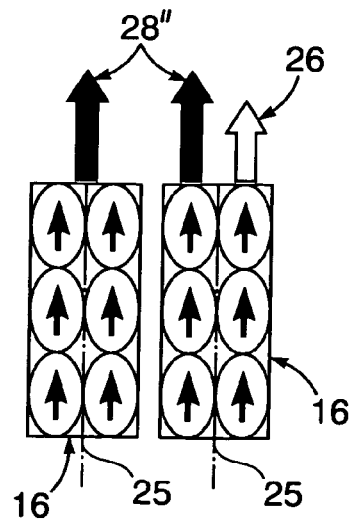

When a tensile stress 28 of less than the built-in stress as indicated by solid black arrow in FIG. 3(C) is applied to the treated or processed material 16 during use, it has no appreciable affect on the magnetic moments 22. If a tensile stress 28' between the value of the built-in stress and the stress required to fully align the moments parallel to the stress axis is applied to the treated material 16 as shown in FIG. 3(D), the magnetic moments 22 are rotated in a direction toward the applied magnetic field 26 parallel to the stress axis 25, resulting in less than full magnetostriction. When the tensile stress 28", large enough to fully align the moment parallel to the stress axis, is applied as shown in FIG. 3(E), no magnetostriction of the treated material 16 is obtained when the magnetic field 26 is applied.

The use of the present invention is shown in FIGS. 3(C) and 3(D), wherein a magnetic field 26 is applied to a positive magnetostrictive material 16 and a built-in stress, wherein the material may be under tension. In use, the external magnetic field 26 is applied along the stress axis. A non-brittle material with positive magnetostriction that has a built-in stress can be used in a variety of novel applications. For example, active structures can be built with the magnetostrictive material being part of the load-bearing structure. In such a structure, unwanted vibrations could be reduced or eliminated by using the magnetostrictive properties of the structure itself (e.g. by wrapping a wire coil around the structural element) as opposed to attaching a separate actuator device. An antenna support affected by wind-caused vibrations is an example of the use of an active structure. As a second example, a vibrating piece of machinery could be decoupled from an overhead mount by building the supports with the magnetostrictive material. A third example would be the use of the inverse magnetostrictive (Villari) effect where the magnetostrictive material containing structure could convert existing vibrations, e.g. vibrations in a ship's hull caused by machinery or wave action, into useable electrical energy.

Obviously, other modifications and variations of the present invention may be possible in light of the foregoing teachings. It is therefore to be understood that within the scope of the appended claims the invention may be practiced otherwise than as specifically described.

What is claimed is:

1. A method of making a positive stress annealed magnetostrictive material capable of sustaining tensile loading, comprising the steps of:
   a. selecting a ferromagnetic alloy having a positive magnetostriction;
   b. applying a compressive stress uniaxially to the ferromagnetic alloy along a predetermined stress axis while a magnetic field is being applied uniaxially along an axis perpendicular to the predetermined stress axis;

c. heating the ferromagnetic alloy to a temperature below the material softening temperature of the ferromagnetic alloy while the magnetic field and the compression stress are being applied thereto;
d. cooling the heated ferromagnetic alloy while the magnetic field and the compression stress are being applied thereto; and
e. forming a positive stress-annealed magnetostrictive material capable of sustaining tensile loading.

2. The method of claim 1, wherein said ferromagnetic alloy comprises iron and gallium, aluminum, beryllium, cobalt, or any combination thereof.

3. The method of claim 2, wherein said ferromagnetic alloy is selected from the group consisting of $Fe_{1-x}Ga_x$ and $Fe_{1-x-y}Ga_xAl_y$ where x+y is less than 0.35.

* * * * *